(12) United States Patent
Wei et al.

(10) Patent No.: US 7,502,984 B2
(45) Date of Patent: Mar. 10, 2009

(54) METHOD AND APPARATUS FOR TRANSMITTING AND RECEIVING A BLOCK OF DATA IN A COMMUNICATION SYSTEM

(75) Inventors: Yongbin Wei, San Diego, CA (US); Durga P. Malladi, San Diego, CA (US); Tao Chen, San Diego, CA (US); Edward G. Tiedemann, Jr., Concord, MA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/623,699

(22) Filed: Jan. 16, 2007

(65) Prior Publication Data

US 2007/0162829 A1    Jul. 12, 2007

Related U.S. Application Data

(63) Continuation of application No. 10/338,162, filed on Jan. 7, 2003, now Pat. No. 7,191,384.

(60) Provisional application No. 60/419,358, filed on Oct. 17, 2002.

(51) Int. Cl.
*H03M 13/00*     (2006.01)
(52) U.S. Cl. .................... 714/758; 714/781; 714/786; 714/799
(58) Field of Classification Search ................ 714/752, 714/758, 786, 799
See application file for complete search history.

(56) References Cited

U.S. PATENT DOCUMENTS 5,432,822 A    7/1995    Kaewell, Jr. et al.

(Continued)

FOREIGN PATENT DOCUMENTS

CN           1223515       7/1999

(Continued)

OTHER PUBLICATIONS

TIA/EIA-IS-95, "Mobile Station-Base Station Compatibility Standard for Dual-Mode Wideband Spread Spectrum Cellular System", Jul. 1993.

(Continued)

*Primary Examiner*—Esaw T Abraham
(74) *Attorney, Agent, or Firm*—Won Tae Kim; James K. O'Hare; Thomas R. Rouse

(57) ABSTRACT

A method and apparatus for transmitting and receiving data provide for efficient use communication resources by encoding data in accordance with a first code to produce a block of data, determining transmission data rate of a time frame, selecting a portion of the block of data based on the determined transmission data rate, adding a location identifier data to the portion of data to produce a payload data, wherein the location identifier identifies a location of the portion of data within the block of data, and encoding the payload data in accordance with a second code to produce a packet of data for transmission over the time frame. A transmitter transmits the packet of data over the time frame at the determined data rate. A receiver receives the packet of data over the time frame, and processes the received data accordingly to reproduce the block of data.

7 Claims, 8 Drawing Sheets

U.S. PATENT DOCUMENTS

| | | | |
|---|---|---|---|
| 5,568,184 A * | 10/1996 | Shibata et al. | 348/14.09 |
| 5,608,738 A | 3/1997 | Matsushita | |
| 6,212,660 B1 | 4/2001 | Joeressen et al. | |
| 6,400,731 B1 | 6/2002 | Nitta | |
| 6,697,988 B2 | 2/2004 | Kim et al. | |
| 6,757,654 B1 * | 6/2004 | Westerlund et al. | 704/262 |
| 6,968,498 B1 * | 11/2005 | Pal | 714/807 |

FOREIGN PATENT DOCUMENTS

| | | |
|---|---|---|
| CN | 1316139 | 10/2001 |
| EP | 1233564 | 8/2002 |
| WO | 00044122 | 7/2000 |
| WO | 00072474 | 11/2000 |

OTHER PUBLICATIONS

TIA/EIA/IS-856, "CDMA2000 High Rate Packet Data Air Interface Specification", Nov. 2000.

International Search Report - PCT/US03/33036 - International Search Authority, European Patent Office - Mar. 17, 2004.

International Preliminary Examination Report - PCT/US03/33036 - IPEA, US - Aug. 3, 2004.

European Search Report - EP07019632 - Search Authority, The Hague - Nov. 27, 2007.

* cited by examiner

US 7,502,984 B2

METHOD AND APPARATUS FOR TRANSMITTING AND RECEIVING A BLOCK OF DATA IN A COMMUNICATION SYSTEM

CLAIM OF PRIORITY UNDER 35 U.S.C. §120

The present Application for Patent is a continuation application of U.S. patent application Ser. No. 10/338,162 entitled "Method and Apparatus for Transmitting and Receiving a Block of Data in a Communication System" filed Jan. 7, 2003, now allowed, which claims priority to U.S. Provisional Application Ser. No. 60/419,358, filed Oct. 17, 2002 entitled "Method and Apparatus for Communications of Data to Multiple Receiving Stations in a Communication System", and assigned to the assignee hereof and hereby expressly incorporated by reference herein.

BACKGROUND OF THE INVENTION

1. Field

The present invention relates generally to the field of communications, and more particularly, to data communications in a communication system.

2. Background

In a wireless communication system, unnecessary and excessive transmissions by a user may cause interference for other users in addition to reducing the system capacity. The unnecessary and excessive transmission may be caused by inefficient flow of data in the communication system. The data communicated between two end users may pass through several layers of protocols for assuring proper flow of data through the system. Normally, a base station may receive a block of data for transmission to a mobile station. The block of data is encoded via a block outer code. The outer encoded data is partitioned into frames of data for transmission over one or more physical layer frames. Each physical layer frame of data is encoded using a physical code, and is transmitted over several time slots. The proper delivery of data in at least one aspect is assured through a system of checking for error in each frame of data, and requesting a retransmission of the same frame of data if an unacceptable error or error rate is detected in the frame of data. The block of data may be any type of data, for example, music data, video data, etc. As such, after receiving the frames of data of a bock of data, the mobile station reconstructs the block of data to play the music or video, for example.

More specifically, the wireless communication system may be operating in accordance with the code division multiple access (CDMA) technique which has been disclosed and described in various standards published by the Telecommunication Industry Association (TIA) and other standards organizations. Such standards include the TIA/EIA-IS-2000 standard. A copy of the standards may be obtained by accessing the world wide web at the domain: 3gpp2.org, or by writing to TIA, Standards and Technology Department, 2500 Wilson Boulevard, Arlington, Va. 22201, United States of America. In one aspect, the wireless communication system operating in accordance with the IS-2000 protocol has an option of providing supplemental channels to the mobile stations at fixed or variable data rates. The supplemental channels may be used to transmit a block of data to the mobile station at a fixed data rate or variable data rate. In another aspect, the wireless communication system operating in accordance with the IS-2000 protocol has an option of providing forward packet data channels (F-PDCH) to the mobile stations at variable data rates, variable physical layer frame durations, and variable modulation formats. The F-PDCHs may be used to transmit a block of data to the mobile station at a variable data rate. However, variable formats, including data rate, modulation and frame duration, communication may be possible in any wireless communication.

At fixed data rate and continuous transmission over the supplemental channel, the base station partitions the block of data in accordance with the fixed data rate. Each partition of the block of data may be multiplexed as a packet of data for transmission over a physical layer frame. A frame of data may be transmitted to the mobile station over several time slots. Since the data rate over the supplemental channel is fixed, each frame of data may have the same size data payload. As such, the packets of data from a partitioned block of data are also at the same size. Moreover, since the transmission is continuous, the mobile station can determined how much data is missing if it doesn't receive a frame. Therefore, the mobile station may easily determine the location of the retransmitted frame of data in the block and reconstruct the entire block of data.

However, reconstructing the block of data may not be feasible or easily possible when the data is transmitted to the mobile station at variable rate or in a discontinuous format. This is the case either when the transmission of the supplemental channel is discontinuous and unknown to the mobile station or the F-PDCH is used. For the F-PDCH, the size of the payload of a frame may vary from frame to frame. For variable data rate, the size of payload in each frame of data may vary. As such, the packets of data from the partitioned block of data are not necessarily at the same size. If a frame of data is received in error and, therefore, the size of the frame is unknown to the mobile station, it is infeasible for the mobile station to determine the location of the subsequently received frames of data, including any retransmission frames of data, in the block of data for reconstructing the block of data. Moreover, if the format of the discontinuous transmission time is unknown to the mobile stations, it is also not feasible or easily possible for the mobile stations to determine the location of any received frame of data within the block of data.

Therefore, there is a need, at least for IS-2000 system with supplemental channels variable data rate with non-continuous transmission and F-PDCH, to provide a system, method and apparatus for communication of a block of data and reconstructing the block of data at a receiving mobile station.

SUMMARY

A method and apparatus for transmitting and receiving data provide for efficient use communication resources by encoding data in accordance with a first code to produce a block of data, determining transmission data rate of a time frame, selecting a portion of the block of data based on the determined transmission data rate, adding a location identifier data to the portion of data to produce a payload data, wherein the location identifier identifies a location of the portion of data within the block of data, and encoding the payload data in accordance with a second code to produce a packet of data for transmission over the time frame. A transmitter transmits the packet of data over the time frame at the determined data rate. A receiver receives the packet of data over the time frame. At the receiver, the packet of data received over the time frame is decoded in accordance with the second code to produce the payload data. The location identifier data is detected from the received payload data to produce the portion of the block of data. The received portion of the block of data is decoded in accordance with the first code to produce the block of data. A cyclic redundancy check may be determined based on the selected portion of data, and added to the location identifier data and the portion of data to produce the payload data for transmission. At the receiver, after receiving the packet of data, the cyclic redundancy check is detected and determined for receive data processing.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Generally stated, a novel and improved method and apparatus provide for efficient use of communication resources in a communication system. The system, method and apparatus provide for adding a location identifier to a frame of data before transmission from a base station. The location identifier allows for determining the location of the frame of data in a block of data. The mobile station reconstructs the block of data by relying on the location identifier in each frame of data. In one aspect, the location identifier is added to the frame of data after encoding the data in accordance with an outer code. A physical layer code additionally encodes the frame of data with the location identifier to produce a frame of data for transmission to a mobile station in a communication system. One or more exemplary embodiments described herein are set forth in the context of a digital wireless data communication system. While use within this context is advantageous, different embodiments of the invention may be incorporated in different environments or configurations. In general, the various systems described herein may be formed using software-controlled processors, integrated circuits, or discrete logic. The data, instructions, commands, information, signals, symbols, and chips that may be referenced throughout the application are advantageously represented by voltages, currents, electromagnetic waves, magnetic fields or particles, optical fields or particles, or a combination thereof. In addition, the blocks shown in each block diagram may represent hardware or method steps.

More specifically, various embodiments of the invention may be incorporated in a wireless communication system operating in accordance with the code division multiple access (CDMA) technique which has been disclosed and described in various standards published by the Telecommunication Industry Association (TIA) and other standards organizations. Such standards include the TIA/EIA-95 standard, TIA/EIA-IS-2000 standard, IMT-2000 standard, UMTS and WCDMA standard, all incorporated by reference herein. A system for communication of data is also detailed in the "TIA/EIA/IS-856 cdma2000 High Rate Packet Data Air Interface Specification," incorporated by reference herein. A copy of the standards may be obtained by accessing the world wide web at the domain 3gpp2.org, or by writing to TIA, Standards and Technology Department, 2500 Wilson Boulevard, Arlington, Va. 22201, United States of America. The standard generally identified as UMTS standard, incorporated by reference herein, may be obtained by contacting 3GPP Support Office, 650 Route des Lucioles-Sophia Antipolis, Valbonne-France.

Figure 1:
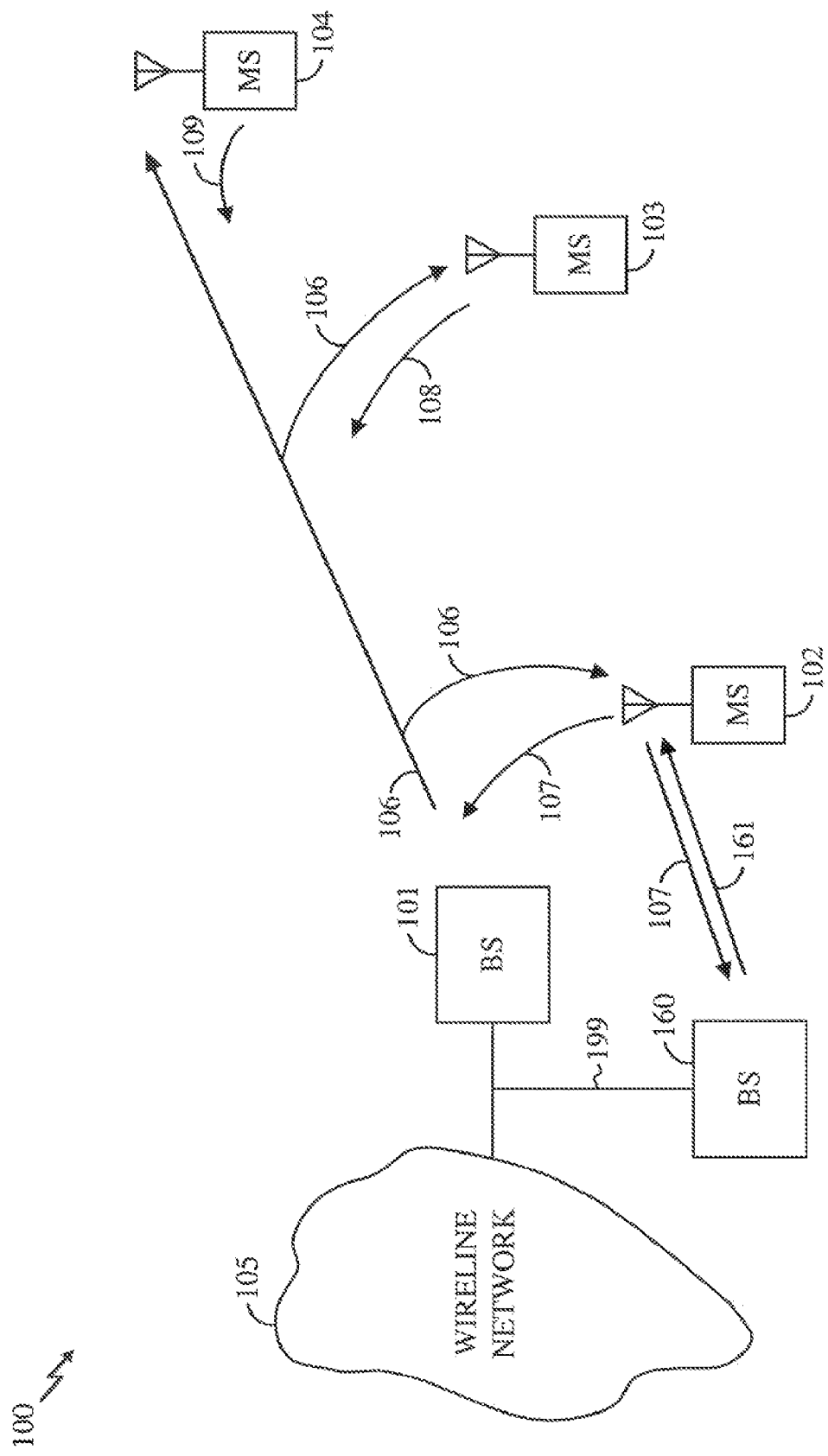
FIG. 1 depicts a communication system for transmitting and receiving data in accordance with various aspects of the invention.

FIG. 1 illustrates a general block diagram of a communication system 100 capable of operating in accordance with any of the code division multiple access (CDMA) communication system standards while incorporating various embodiments of the invention. Communication system 100 may be for communications of voice, data or both. Generally, communication system 100 includes a base station 101 that provides communication links between a number of mobile stations, such as mobile stations 102-104, and between the mobile stations 102-104 and a public switch telephone and data network 105. The mobile stations in FIG. 1 may be referred to as data access terminals (AT) and the base station as a data access network (AN) without departing from the main scope and various advantages of the invention. Base station 101 may include a number of components, such as a base station controller and a base transceiver system. For simplicity, such components are not shown. Base station 101 may be in communication with other base stations, for example base station 160. A mobile switching center (not shown) may control various operating aspects of the communication system 100 and in relation to a back-haul 199 between network 105 and base stations 101 and 160.

Base station 101 communicates with each mobile station that is in its coverage area via a forward link signal transmitted from base station 101. The forward link signals targeted for mobile stations 102-104 may be summed to form a forward link signal 106. The forward link may carry a number of different forward link channels. Such forward link channels include forward fundamental channel, control channel, supplemental channel, and the F-PDCH. A fundamental channel is normally assigned to a mobile station for duration of a call session. The supplemental channels may be shared among the mobile stations. The F-PDCH may also be shared among the mobile stations. The base station at any time may instruct mobile stations to decode a specific supplemental channel or the F-PDCH if it decides to transmit data to the mobile stations on the supplemental channel or F-PDCH during the specified time. Each of the mobile stations 102-104 receiving forward link signal 106 decodes the forward link signal 106 to extract the information that is targeted for its user. Base station 160 may also communicate with the mobile stations that are in its coverage area via a forward link signal transmitted from base station 160. Mobile stations 102-104 may communicate with base stations 101 and 160 via corresponding reverse links. Each reverse link is maintained by a reverse link signal, such as reverse link signals 107-109 for respectively mobile stations 102-104. The reverse link signals 107-109, although may be targeted for one base station, may be received at other base stations.

Base stations 101 and 160 may be simultaneously communicating to a common mobile station. For example, mobile station 102 may be in close proximity of base stations 101 and 160, which can maintain communications with both base stations 101 and 160. On the forward link, base station 101 transmits on forward link signal 106, and base station 160 on the forward link signal 161. On the reverse link, mobile station 102 transmits on reverse link signal 107 to be received by both base stations 101 and 160. For transmitting a packet of data to mobile station 102, one of the base stations 101 and 160 may be selected to transmit the packet of data to mobile station 102. On the reverse link, both base stations 101 and 160 may attempt to decode the traffic data transmission from the mobile station 102. The data rate and power level of the reverse and forward links may be maintained in accordance with the channel condition between the base station and the mobile station. The IS-2000 standard allows supplemental channel transmissions at a certain fixed rate. The transmission may be discontinuous. The discontinuous transmission is also referred as DTX. For F-PDCH, the base station may decide to transmit at any time slot. The transmission format, including payload, duration, code rate, modulation, may vary from one transmission to the next transmission.

Figure 2:
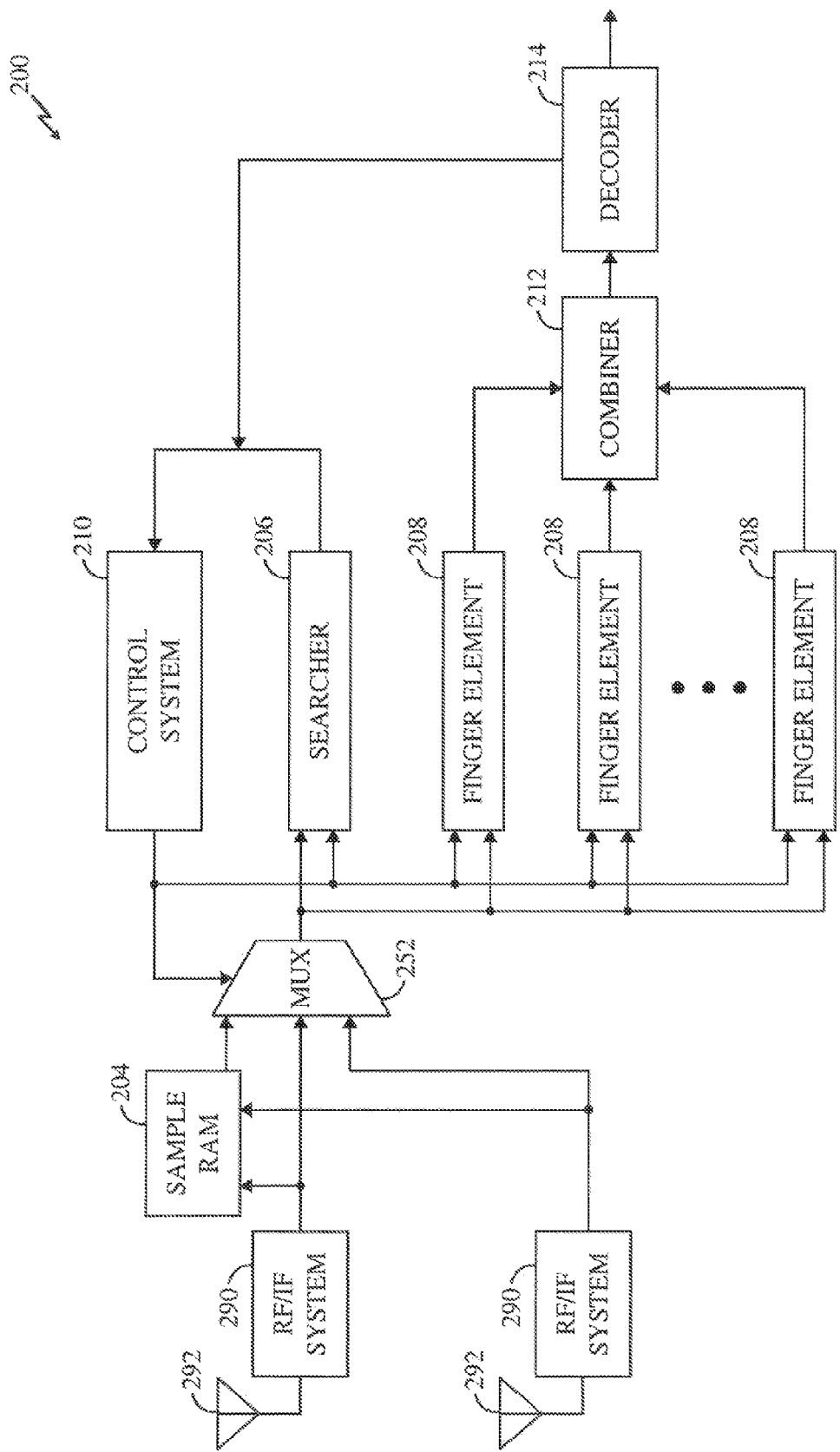
FIG. 2 depicts a receiver system for receiving data in accordance with various aspects of the invention.

FIG. 2 illustrates a block diagram of a receiver 200 used for processing and demodulating the received CDMA signal while operating in accordance with various aspects of the invention. Receiver 200 may be used for decoding the information on the reverse and forward links signals. Receiver 200 may be used for decoding information on the fundamental channel, control channel and supplemental channels. Received (Rx) samples may be stored in RAM 204. Receive samples are generated by a radio frequency/intermediate frequency (RF/IF) system 290 and an antenna system 292. The RF/IF system 290 and antenna system 292 may include one or more components for receiving multiple signals and RF/IF processing of the received signals for taking advantage of the receive diversity gain. Multiple received signals propagated through different propagation paths may be from a common source. Antenna system 292 receives the RF signals, and passes the RF signals to RF/IF system 290. RF/IF system 290 may be any conventional RF/IF receiver. The received RF signals are filtered, down-converted and digitized to form RX samples at base band frequencies. The samples are supplied to a multiplexer (mux) 252. The output of mux 252 is supplied to a searcher unit 206 and finger elements 208. A control system 210 is coupled thereto. A combiner 212 couples a decoder 214 to finger elements 208. Control system 210 may be a microprocessor controlled by software, and may be located on the same integrated circuit or on a separate integrated circuit. The decoding function in decoder 214 may be in accordance with a turbo decoder or any other suitable decoding algorithms. The signal transmitted from a source may be encoded with several layers of codes. The decoder 214 may perform decoding function in accordance with two or more codes. For example, the transmitted data may be encoded at two different layers, an outer layer and a physical layer. The physical layer may be in accordance with the Turbo code, and the outer layer may be in accordance with Reed Solomon code. As such, the decoder 214 decodes the received samples in accordance with such codes.

During operation, received samples are supplied to mux 252. Mux 252 supplies the samples to searcher unit 206 and finger elements 208. Control unit 210 configures finger elements 208 to perform demodulation and despreading of the received signal at different time offsets based on search results from searcher unit 206. The results of the demodulation are combined and passed to decoder 214. Decoder 214 decodes the data and outputs the decoded data. Despreading of the channels is performed by multiplying the received samples with the complex conjugate of the PN sequence and assigned Walsh function at a single timing hypothesis and digitally filtering the resulting samples, often with an integrate and dump accumulator circuit (not shown). Such a technique is commonly known in the art. Receiver 200 may be used in a receiver portion of base stations 101 and 160 for processing the received reverse link signals from the mobile stations, and in a receiver portion of any of the mobile stations for processing the received forward link signals.

The decoder 214 may accumulate the combined energy for detection of a data symbol. Each packet of data may carry a cyclic redundancy check (CRC) field. The decoder 214 may in connection with control system 210 and or other control systems check for error in the received data packet. If the CRC data does not pass, the received packet of data has been received in error. The control system 210 and or other control systems may send a negative acknowledgment message to the transmitter to retransmit the packet of data.

Figure 3:
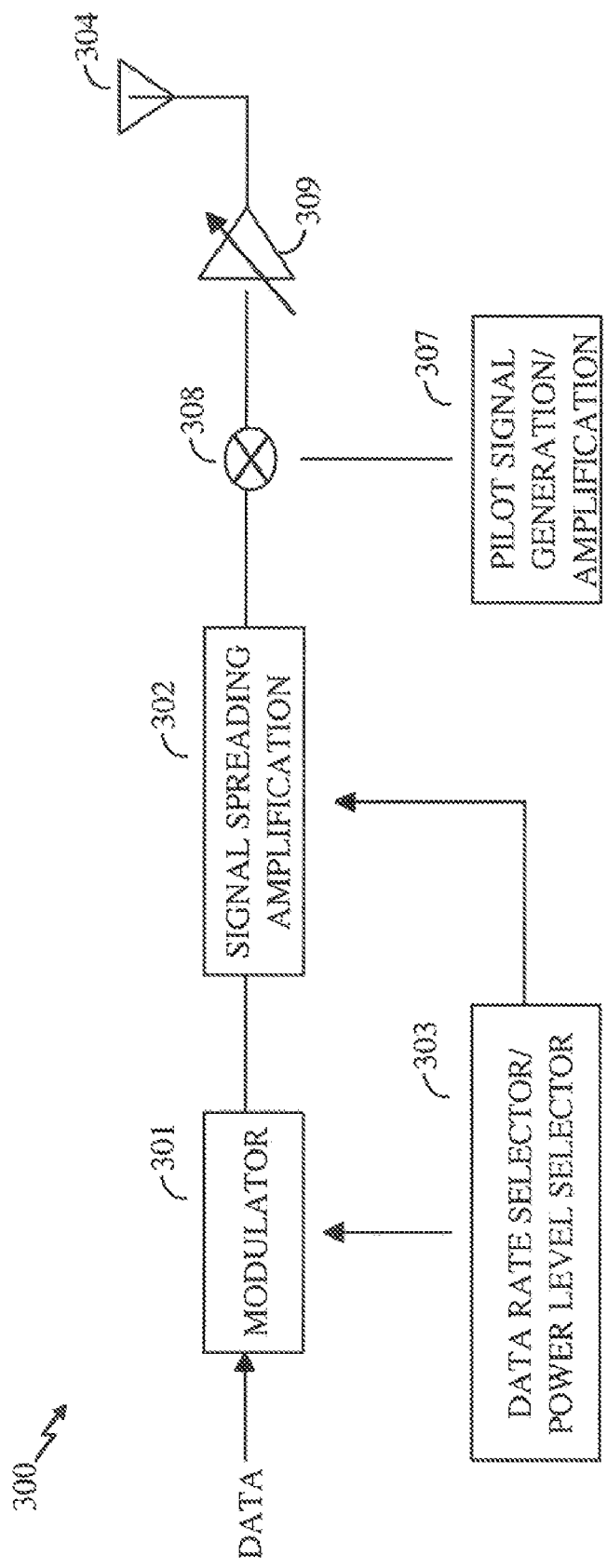
FIG. 3 depicts a transmitter system for transmitting data in accordance with various aspects of the invention.
Figure 4:
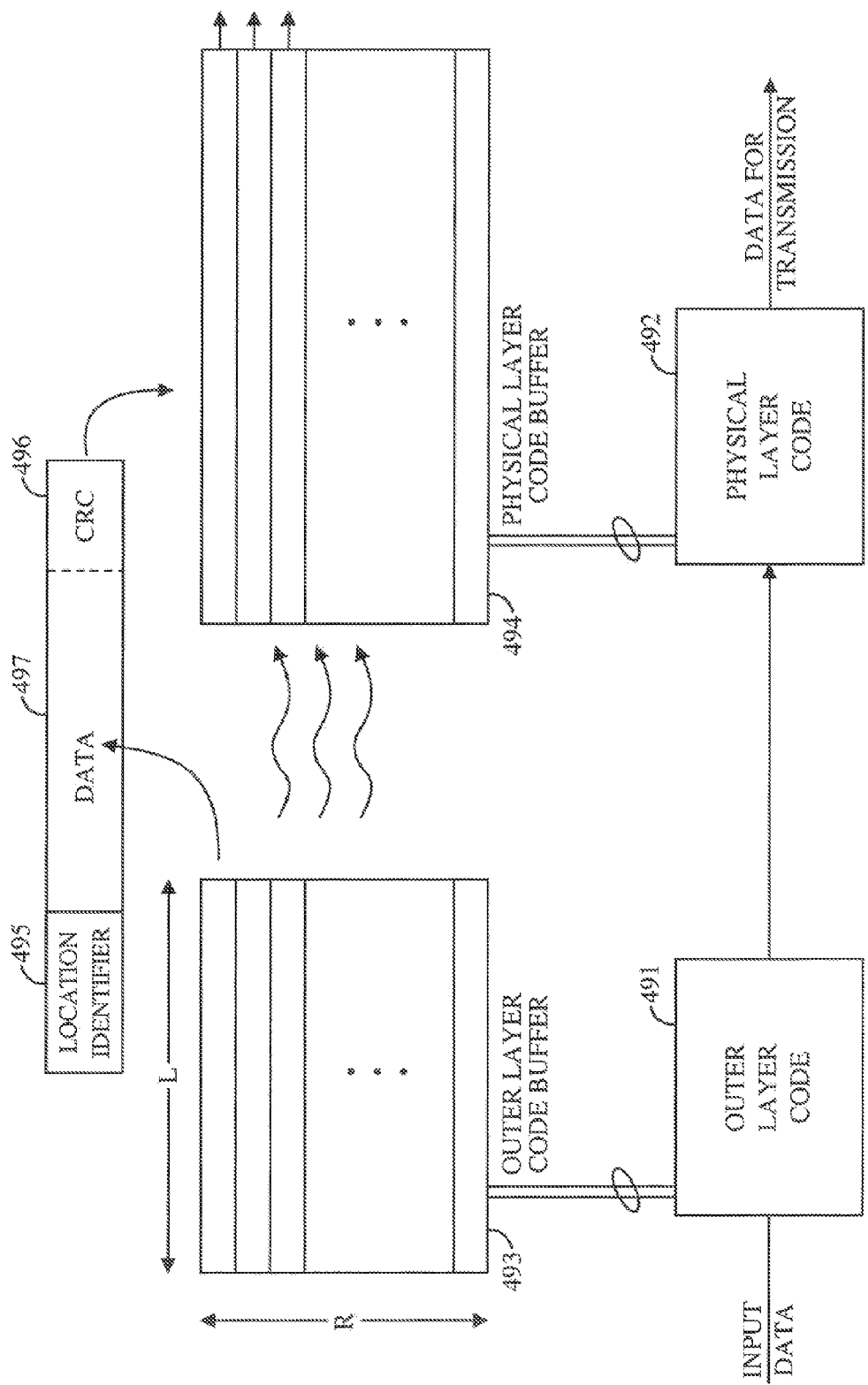
FIG. 4 depicts an outer layer code and physical layer code and associated buffers for encoding data in accordance with various aspects of the invention.

FIG. 3 illustrates a block diagram of a transmitter 300 for transmitting the reverse and forward link signals. The transmitter 300 may be used for transmission of fundamental channels, control channels, supplemental channels and the F-PDCH. The channel data for transmission are input to a modulator 301 for modulation. The modulation may be according to any of the commonly known modulation techniques such as QAM, PSK or BPSK. Before modulation, the channel data for transmission may pass through one or more layers of coding. Referring to FIG. 4, the coding of the channel data for transmission may be described. For data on the fundamental channels and control channels, the input data may directly pass to the physical layer code 492 for coding, for example in accordance with the convolutional code or turbo code. The channel data for transmission are produced for modulator 301. For supplemental channels or F-PDCH, the input data may pass through outer code 491 and physical layer code 492 to produce channel data for transmission. The channel data for transmission are received by the modulator 301. The outer code 491 may be in accordance with Reed Solomon code. The physical layer code 492 may be in accordance with block code, convolutional code or turbo code. The outer code 492 may have an associated outer code buffer 493, and the physical layer code 492 may have an associated physical layer code buffer 494 to hold the data during processing time. In accordance with various aspects of the invention, a location identifier 495 is added to a frame of data at the output of the outer code 491. The resulting frame of data 497 is encoded in the physical layer code 492. The location identifier 495 identifies the location of the payload data within a partitioned block of data. The location identifier 495 allows a receiving destination to easily reconstruct the block of data. The frame of data 497 is encoded by the physical layer code 492 to produce the channel data for transmission.

The resulting channel data for transmission at the output of the physical layer code 492 is modulated in modulator 301. The modulation data rate may be selected by a data rate and power level selector 303. The data rate selection may be based on feedback information received from a destination. The data rate very often is based on the channel condition, among other considered factors. The channel condition may change from time to time. The data rate selection may also be based on the data arrival rate to the outer code 491, which may change from time to time. As a result, the selected data rate also changes from time to time accordingly. The physical layer transmission of the communication system 100 may be over fixed frames and time slots. As a result, the amount of data for transmission may vary in accordance with the data rate. Consequently, the amount of data passed to the physical layer code 492 from the outer layer code 491 may change from time to time for the supplemental channel or F-PDCH transmission.

The data rate and power level selector 303 accordingly selects the data rate in modulator 301. The output of modulator 301 passes through a signal spreading operation and amplified in a block 302 for transmission from an antenna 304. The data rate and power level selector 303 also selects a power level for the amplification level of the transmitted signal. The combination of the selected data rate and the power level allows proper decoding of the transmitted data at the receiving destination. A pilot signal is also generated in a block 307. The pilot signal is amplified to an appropriate level in block 307. The pilot signal power level may be in accordance with the channel condition at the receiving destination. The pilot signal may be combined with the channel signal in a combiner 308. The combined signal may be amplified in an amplifier 309 and transmitted from antenna 304. The antenna 304 may be in any number of combinations including antenna arrays and multiple input multiple output configurations.

Figure 5:
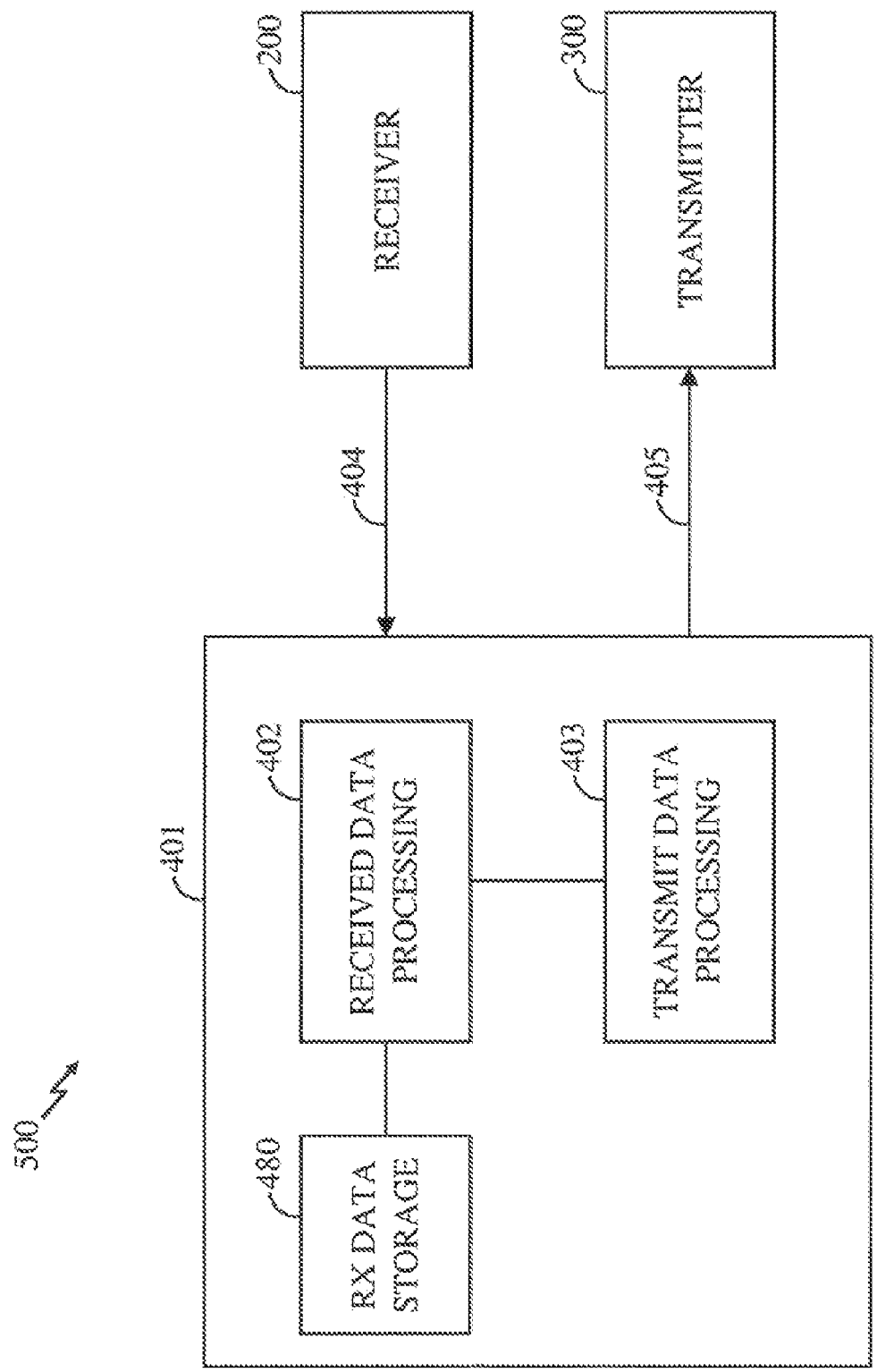
FIG. 5 depicts a transceiver system for transmitting and receiving data in accordance with various aspects of the invention.

FIG. 5 depicts a general diagram of a transceiver system 500 for incorporating receiver 200 and transmitter 300 for maintaining a communication link with a destination, including supplementary channel communications at variable data rates or F-PDCH. The transceiver 500 may be incorporated in a mobile station or a base station. A processor 401 may be coupled to receiver 200 and transmitter 300 to process the received and transmitted data. Various aspects of the receiver 200 and transmitter 300 may be common, even though receiver 200 and transmitter 300 are shown separately. In one aspect, receiver 200 and transmitter 300 may share a common local oscillator and a common antenna system for RF/IF receiving and transmitting. Transmitter 300 receives the data for transmission on input 405. Transmit data processing block 403 prepares the data for transmission on a transmit channel. Received data, after being decoded in decoder 214, are received at processor 401 at an input 404. Received data are processed in received data processing block 402 in processor 401. Various operations of processor 401 may be integrated in a single or multiple processing units. The transceiver 500 may be connected to another device. The transceiver 500 may be an integral part of the device. The device may be a computer or operates similar to a computer. The device may be connected to a data network, such as Internet. In case of incorporating the transceiver 500 in a base station, the base station through several connections may be connected to a network, such as Internet.

The processing of the received data generally includes checking for error in the received packets of data. The receive data storage block 480 may accumulate data received in each frame of data to reconstruct the entire block of data. In order to reconstruct the entire block of data communicated via supplemental channels or F-PDCHs, the transceiver 500 processes each received frame of data for detecting the location information encoded in the location identifier 495, in accordance with various aspects of the invention. At the transmitter, in accordance with various aspects of the invention, data selected from outer code buffer 493, for transmission on a physical channel, is added with a location identifier field 495, shown in FIG. 4. Additionally, a CRC field 496 may also be added. The resulting frame of data 497 that includes location identifier 495 and CRC 496 is passed on to the physical layer code 492 for encoding in accordance with the physical layer code, and for further processing by transmitter 300 for transmission. Furthermore, in order to reconstruct the entire block of data communicated via supplemental channels or F-PDCHs, the transceiver 500 processes each received frame of data for detecting the location information encoded in the location identifier 495 and CRC 496, in accordance with various aspects of the invention.

Figure 6:
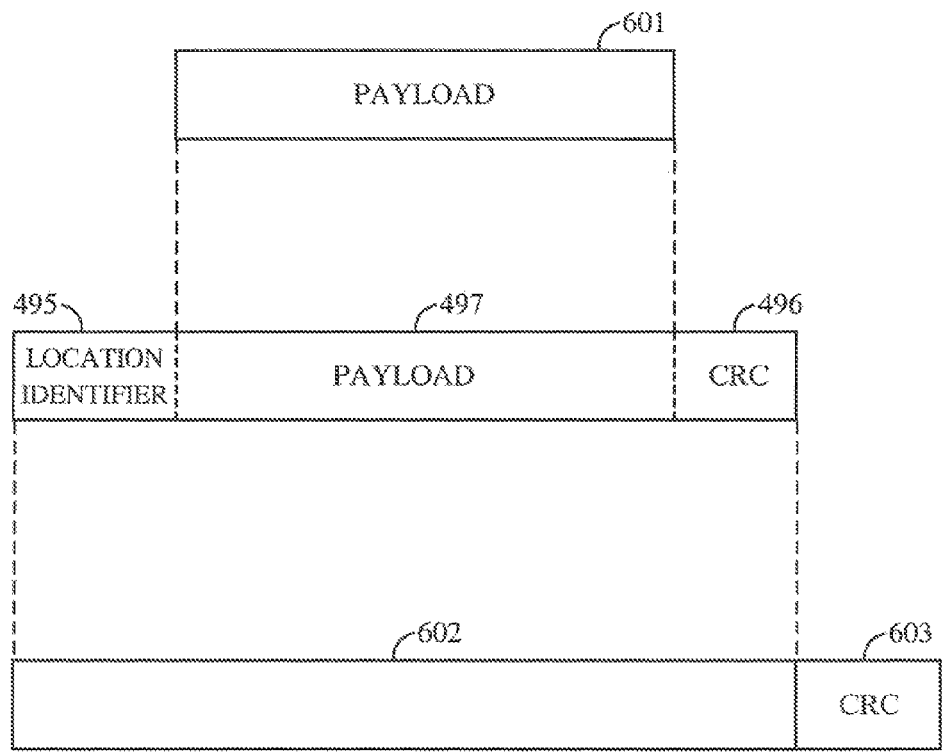
FIG. 6 depicts payload and a packet of data formatted in accordance with various aspects of the invention.

Referring to FIG. 6, the flow of data from outer code 491 to the channel data for transmission at the output of physical layer code 492 is shown, in accordance with various aspects of the invention. The payload 601 is selected from the outer code buffer 493. The location of payload 601 in the block of data is identified, and the location identifier is inserted at the location identifier 495. Optionally, a CRC is created for the data contained in the payload 601 and location identifier 495. The CRC is added to the data at the CRC field 496 to create the data frame 497. The resulting frame of data 497 is coded in accordance with the physical layer code 492 for channel data transmission. A new CRC may be created based on the resulting data. The CRC is added in the CRC field 603 to produce the physical layer frame of data 602 for channel data transmission. Transceiver 500 may be incorporated in a transmitting source and a receiving destination. The transmitting source may be a base station, and a receiving destination may be a mobile station, in accordance with various aspects of the invention. In the transceiver 500, at a transmitting source, the transmitter 300 in connection with processor 401 and its internal sections, such as transmit data processing block 403, prepares the data for transmission in accordance with various aspects of the invention for adding the location identifier field 495 and, optionally, CRC field 496. Moreover, in the transceiver 500, at a receiving destination, receiver 200 in connection with processor 401 and its internal sections, such as receive data processing block 402 and receive data storage block 480, prepares the data for reconstructing the received block of data in accordance with various aspects of the invention by identifying the location identifier field 495 and, optionally, CRC field 496.

Figure 7:
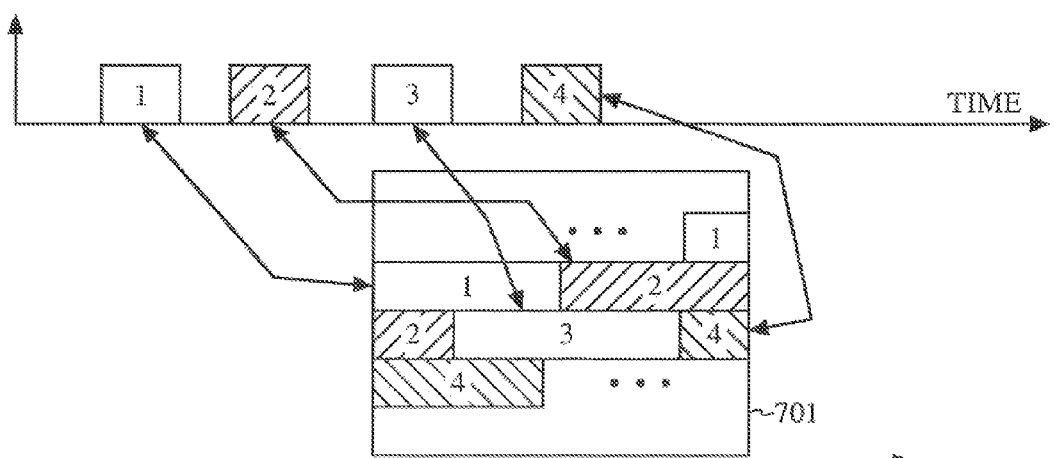
FIG. 7 depicts portions of a block of data selected for over the air transmission and reception in accordance with various aspects of the invention.

Referring to FIG. 7, a time line 700 for transmissions and receptions of data frames from and to the outer code buffer 493 is shown. On the transmission side, the data frames 1, 2, 3 and 4 with different payload sizes are selected from a partitioned block of data 701 for transmission. The outer code buffer 493 may hold the partitioned block of data 701. The data frames 1, 2, 3 and 4 may be from the same partitioned block of data 701. The size of each frame is based on the physical layer data rate used for transmission. As such, the size of data frames 1, 2, 3 and 4 may be different at different times. The location identifier field 495 and optionally CRC field 496 are added to each frame of data before the physical layer code 492, in accordance with various aspects of the invention. On the receiving side, each frame of data is decoded with the physical layer decoder. The resulting frames are organized to reconstruct the block of data 701 in accordance with the information contained in the location identifier field 495, in accordance with various aspects of the invention. In one aspect, the location identifier field 495 may identify the frame of data as the starting point of the payload data of the block of data in the outer code buffer. Other similar location identifiers may also be used. If for example the data frame 3 is lost in transmission, a retransmission of data frame 3 places the data frame between the data frames 2 and 4. As such, reconstructing the block of data is easily accomplished at the receiving destination.

Figure 8:
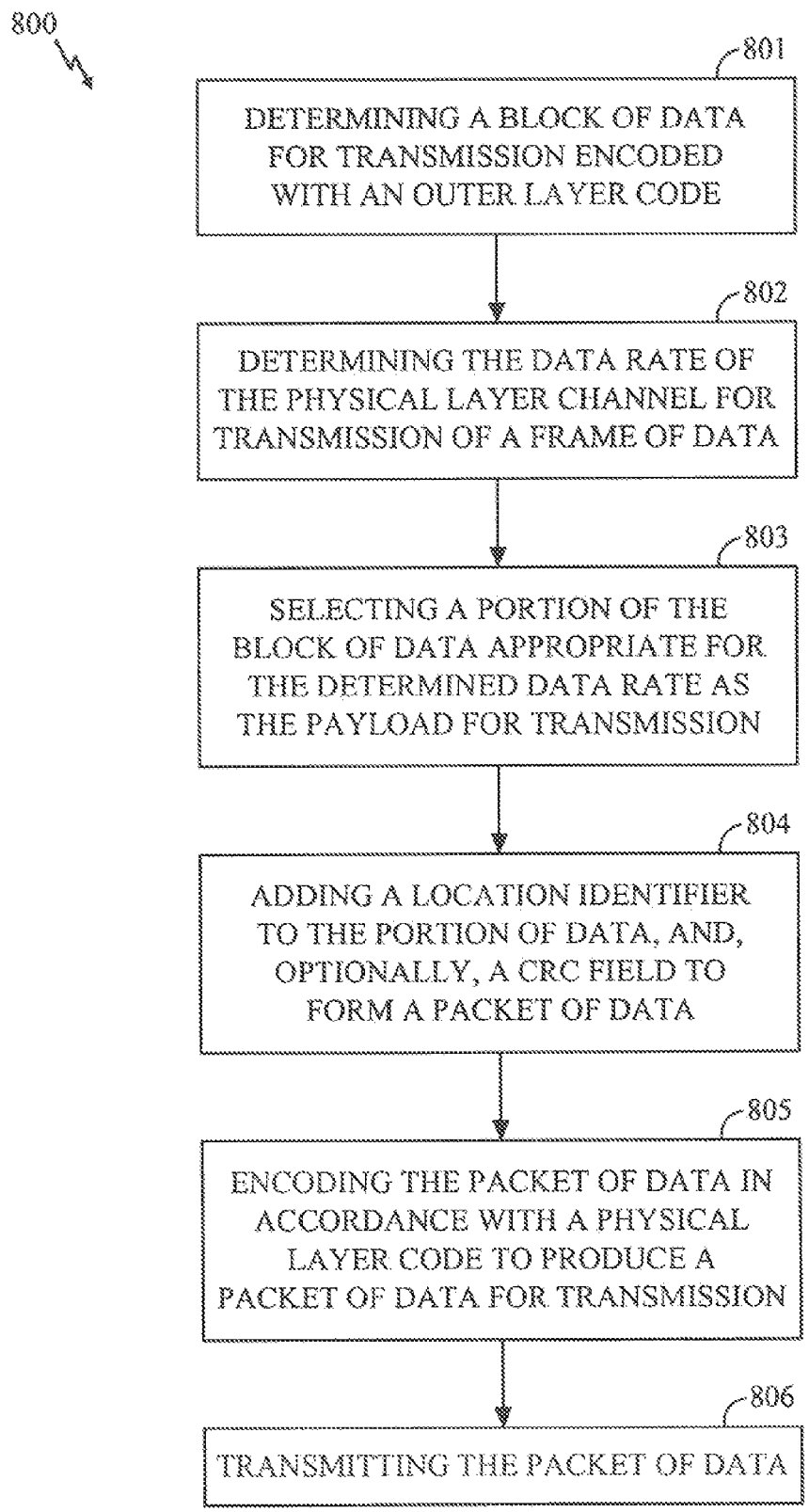
FIG. 8 depicts various steps for processing data for transmission in accordance with various aspects of the invention.

Referring to FIG. 8, a flow chart 800 provides several steps that may be necessary for processing each frame of data in transceiver 500 for transmission, in accordance with various aspects of the invention. The steps may be performed by processor 401 in connection with various operating blocks such as transmit data processing block 403. At step 801, a block of data, such as block of data 701, is determined for transmission. The block of data is encoded at the outer layer code 491. The block of code may reside in outer layer code buffer 493. The outer layer code buffer 493 may be located in processor 401. At step 802, the data rate of the physical layer channel used for transmission over the air is determined. The data rate may be determined for a frame of data. The transmission duration of a frame may be fixed for example, 20 mSec, as for the supplemental channel. The transmission duration of a frame may be change from frame to frame, as for the F-PDCH. At step 803, a portion of the block of data, such as payload 601 shown in FIG. 6, is selected for transmission as the payload of the frame of data for transmission. The amount of data in the selected payload is appropriate for the selected physical layer data rate. For example, the amount of data selected for high data rate is proportionally higher than low data rate in a payload. At step 804, a location identifier, such as location identifier 495, is added to the payload. Optionally, a CRC 496 may also be added to form the data packet, such as data packet 497. At step 805, the data packet is sent to the physical layer encoder, where an additional CRC may be added and the packet is encoded in accordance with the physical layer code to produce a packet of data for transmission. At step 806, the packet of data is transmitted from the transmitter 300 after additional processing.

Figure 9:
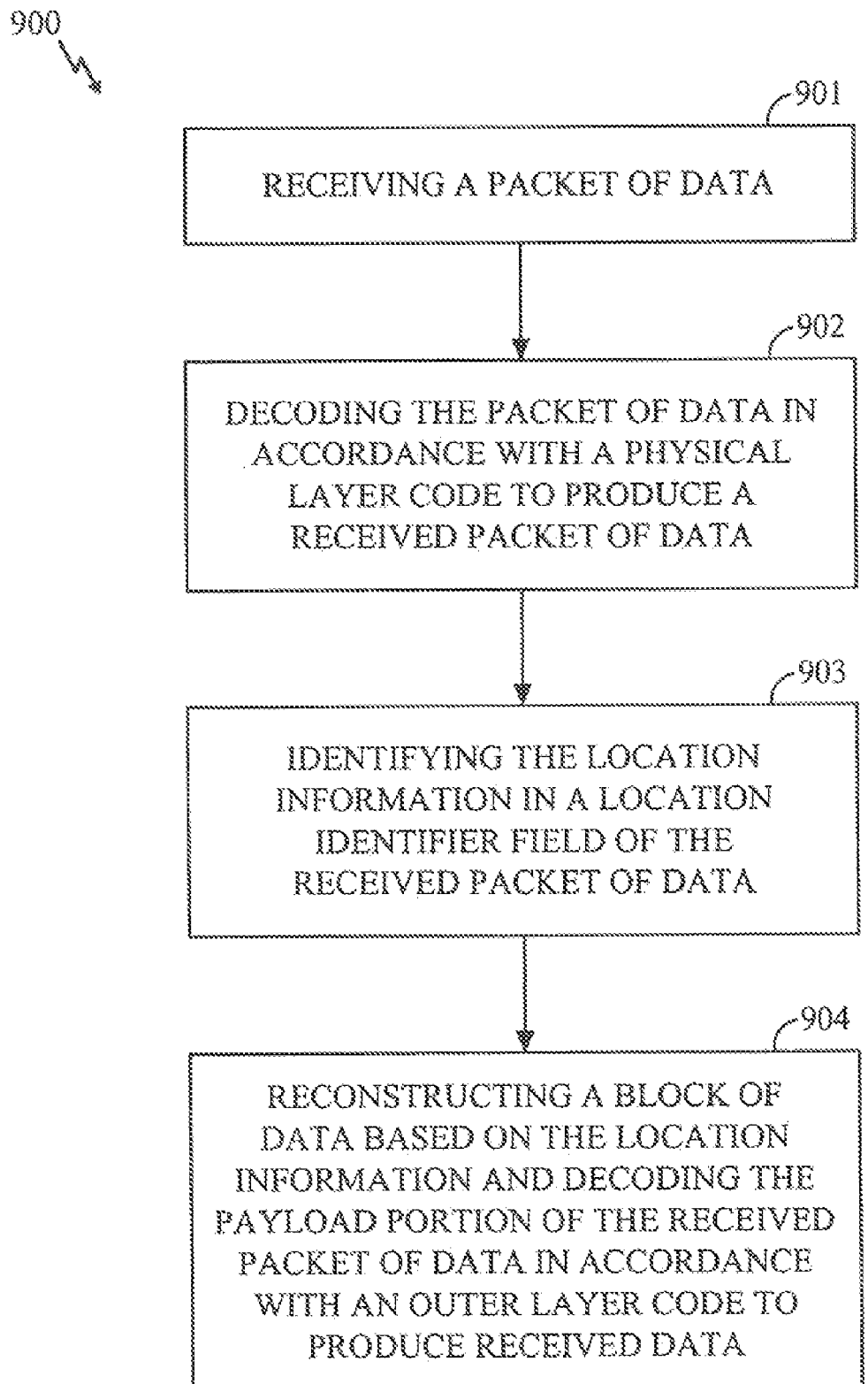
FIG. 9 depicts various steps for processing data for reception in accordance with various aspects of the invention.

Referring to FIG. 9, a flow chart 900 provides several steps that may be necessary for processing each frame in transceiver 500 for receiving in accordance with various aspects of the invention. The steps may be performed by processor 401 in connection with various operating blocks such as receive data processing block 402. At step 901, a frame of data is received by receiver 200. At step 902, the received frame of data is decoded in accordance with the physical layer code to produce a received packet of data. The received packet of data has the format of the packet data 497. If the optional CRC 496 is included in the packet, the integrity of the packet can be checked based on the CRC 496. If the CRC 496 is passed, at step 903, the location information in the location identifier field 495 is identified. At step 904, the payload portion 601 of the packet 497 is written into a receive storage buffer480 based on the location identifier 495. At step 904, a block of data is reconstructed based on the location identification of each received payload and the outer decoding to recover the received data.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

The invention claimed is:

1. A method for receiving data in a wireless communication apparatus, comprising:
    decoding a packet of data received over a time frame in accordance with a first code to produce a payload data;
    detecting a location identifier data from said payload data to produce a portion of a block of data, wherein said location identifier identifies a location of said portion of data within said block of data;
    decoding said portion of said block of data in accordance with a second code to produce said block of data;
    detecting a cyclic redundancy check added to said location identifier data and said portion of data in said payload data; and
    determining said cyclic redundancy check based on said selected portion of data.

2. The method as recited in claim 1 wherein said first code is a physical layer code and said second code is an outer layer code in a wireless communication system.

3. An apparatus for receiving data, comprising:
    a receiver for receiving a packet of data over a time frame;
    a first decoder for decoding the packet of data received over a time frame in accordance with a first code to produce a payload data;
    a controller for detecting a location identifier data from said payload data to produce a portion of a block of data, wherein said location identifier identifies a location of said portion of data within said block of data;
    a second decoder for decoding said portion of said block of data in accordance with a second code to produce said block of data;

wherein said controller is further for detecting a cyclic redundancy check added to said location identifier data and said portion of data in said payload data, and for determining said cyclic redundancy check based on said selected portion of data.

4. The apparatus as received in claim 3 wherein said first code is a physical layer code and said second code is an outer layer code in a wireless communication.

5. A computer-readable medium having stored thereon computer executable instructions, the instructions, when executed by a processor, causing the processor to perform a method, comprising:
   decoding a packet of data received over a time frame in accordance with a first code to produce a payload data;
   detecting a location identifier data from said payload data to produce a portion of a block of data, wherein said location identifier identifies a location of said portion of data within said block of data;
   decoding said portion of said block of data in accordance with a second code to produce said block of data;
   detecting a cyclic redundancy check added to said location identifier data and said portion of data in said payload data; and
   determining said cyclic redundancy check based on said selected portion of data.

6. A processor including a computer readable medium having stored thereon computer executable instructions that are executed by the processor, for performing the following acts:
   decoding a packet of data received over a time frame in accordance with a first code to produce a payload data;
   detecting a location identifier data from said payload data to produce a portion of a block of data, wherein said location identifier identifies a location of said portion of data within said block of data;
   decoding said portion of said block of data in accordance with a second code to produce said block of data;
   detecting a cyclic redundancy check added to said location identifier data and said portion of data in said payload data; and
   determining said cyclic redundancy check based on said selected portion of data.

7. An apparatus for receiving data, comprising:
   means for receiving a packet of data over a time frame;
   means for decoding the packet of data received over a time frame in accordance with a first code to produce a payload data;
   means for detecting a location identifier data from said payload data to produce a portion of a block of data, wherein said location identifier identifies a location of said portion of data within said block of data;
   means for decoding said portion of said block of data in accordance with a second code to produce said block of data;
   wherein said means for detecting a location identifier data from said payload data is further for detecting a cyclic redundancy check added to said location identifier data and said portion of data in said payload data, and for determining said cyclic redundancy check based on said selected portion of data.

* * * * *